(12) United States Patent
MacDonald et al.

(10) Patent No.: US 8,605,428 B2
(45) Date of Patent: Dec. 10, 2013

(54) APPARATUS, SYSTEM AND METHOD FOR CONCEALED VENTING THERMAL SOLUTION

(75) Inventors: Mark MacDonald, Beaverton, OR (US); Shawn S. McEuen, Portland, OR (US)

(73) Assignee: Intel Corporation, Santa Clara, CA (US)

(*) Notice: Subject to any disclaimer, the term of this patent is extended or adjusted under 35 U.S.C. 154(b) by 229 days.

(21) Appl. No.: 13/175,052

(22) Filed: Jul. 1, 2011

(65) Prior Publication Data

US 2013/0003282 A1    Jan. 3, 2013

(51) Int. Cl.
*H05K 7/20* (2006.01)

(52) U.S. Cl.
USPC ............. 361/679.49; 361/679.47; 361/695; 165/80.3; 165/104.33; 165/121; 454/184

(58) Field of Classification Search
USPC .............. 361/679.02, 679.03, 679.09, 361/679.46–679.55, 688, 689–697; 165/80.3, 104.33, 121; 454/184; 312/223.1, 223.2, 111, 204, 236, 265, 312/332.1; 174/50, 520, 522, 526
See application file for complete search history.

(56) References Cited

U.S. PATENT DOCUMENTS

| | | | | |
|---|---|---|---|---|
| 5,071,203 A | * | 12/1991 | Boyd | 312/7.2 |
| 5,694,294 A | * | 12/1997 | Ohashi et al. | 361/679.48 |
| 6,430,042 B1 | * | 8/2002 | Ohashi et al. | 361/679.49 |
| 6,459,573 B1 | * | 10/2002 | DiStefano et al. | 361/679.46 |
| 6,614,656 B1 | * | 9/2003 | Huang | 361/690 |
| 6,628,518 B2 | * | 9/2003 | Behl et al. | 361/679.47 |
| 7,212,403 B2 | * | 5/2007 | Rockenfell | 361/679.47 |
| 7,791,875 B2 | * | 9/2010 | Kumano et al. | 361/679.49 |
| 7,843,691 B2 | * | 11/2010 | Reichert et al. | 361/695 |
| 7,889,500 B2 | * | 2/2011 | Yang et al. | 361/695 |
| 2002/0024795 A1 | | 2/2002 | Bhatia et al. | |
| 2004/0114322 A1 | | 6/2004 | Agata et al. | |
| 2006/0133036 A1 | * | 6/2006 | Durney | 361/695 |
| 2008/0304231 A1 | | 12/2008 | Morino et al. | |
| 2011/0026223 A1 | | 2/2011 | Kaneko | |

OTHER PUBLICATIONS

International Search Report and Written Opinion received for PCT Patent Application No. PCT/US2012/045159, mailed on Dec. 20, 2012, 9 pages.

* cited by examiner

*Primary Examiner* — Michail V Datskovskiy
(74) *Attorney, Agent, or Firm* — Kacvinsky Daisak PLLC

(57) ABSTRACT

Some embodiments of an apparatus, system and method are described for a concealed venting thermal solution. An apparatus may comprise an enclosure arranged around one or more heat generating components, a duct arranged around an internal perimeter of the enclosure and a seam inlet arranged around an external perimeter of the enclosure to allow an airflow to enter the duct. Other embodiments are described.

20 Claims, 5 Drawing Sheets

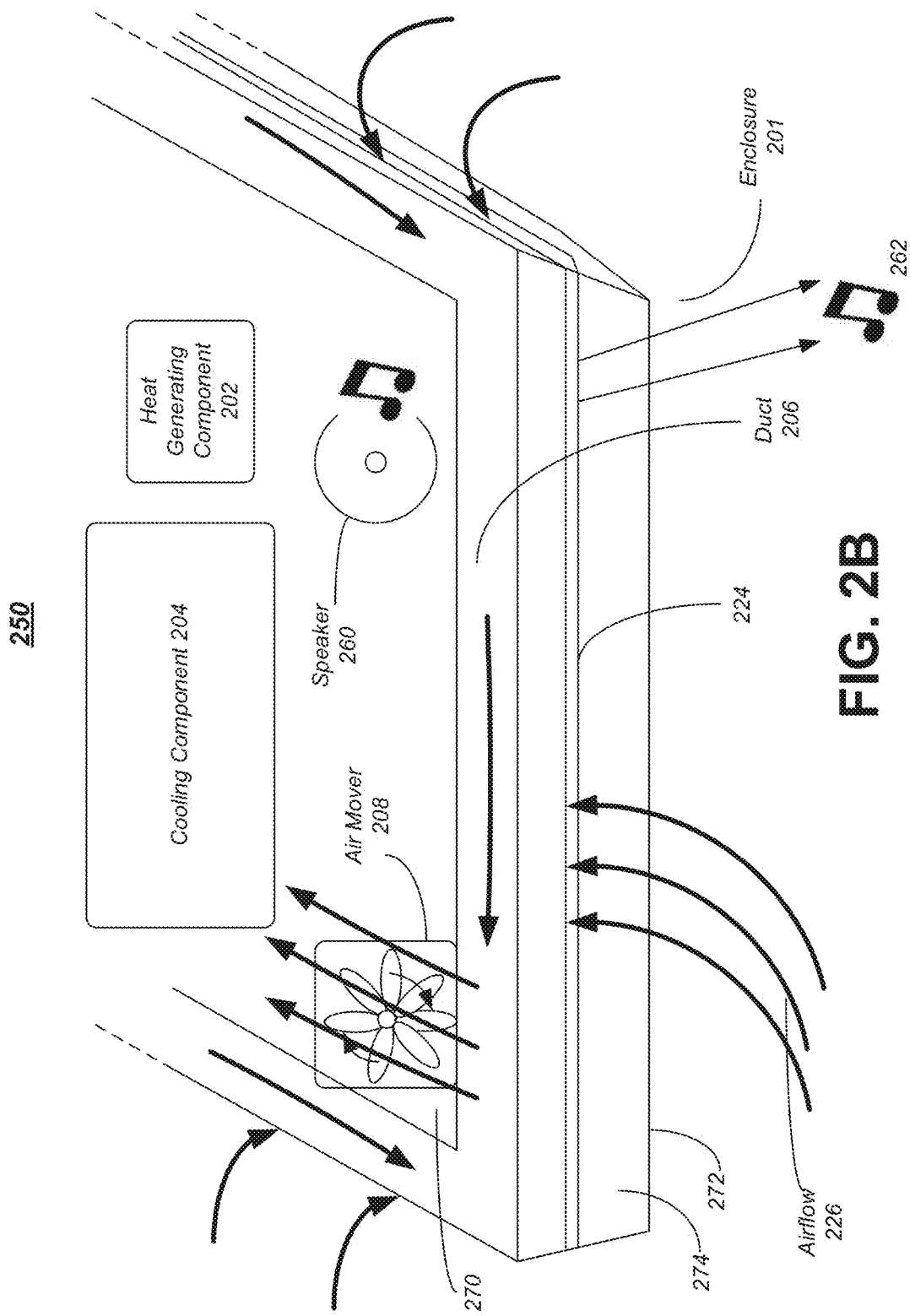

APPARATUS, SYSTEM AND METHOD FOR CONCEALED VENTING THERMAL SOLUTION

BACKGROUND

Modern computing systems generate heat during operation. The heat may affect certain platform components of a system, and is therefore generally required to be dissipated or removed from the system. Heat generated by the computing system may be limited or reduced using various thermal management techniques and/or heat dissipation techniques. For example, heat generated by a processor may be dissipated by creating a flow of air using a fan or blower. Further, various platform-level cooling devices may be implemented in conjunction with the fan or blower to enhance heat dissipation, such as heat pipes, heat spreaders, heat sinks, vents, phase change materials or liquid-based coolants.

Traditional computing systems include vents or other inlets to allow for a flow of air to enter the enclosure of the system to assist with cooling. These vents and other inlets may be undesirable in modern computing system designs, as designers and users prefer the aesthetic appearance of a system having no vents. Nonetheless, many mobile and stationary computer platforms require significant airflow to maintain component operability and acceptable ergonomic comfort levels and adequate venting is still required despite aesthetic considerations. Furthermore, an aesthetic industrial design is also becoming an increasingly important consideration. Consequently, a need exists for a concealed venting thermal solution for computing systems.

BRIEF DESCRIPTION OF THE DRAWINGS

FIG. 2B illustrations one embodiment of a third apparatus.

DETAILED DESCRIPTION

The embodiments are generally directed to techniques designed to improve concealed venting in computing systems. Various embodiments provide techniques that include an enclosure arranged around one or more heat generating components, a duct arranged around an internal perimeter of the enclosure and a seam inlet arranged around an external perimeter of the enclosure to allow an airflow to enter the duct. Other embodiments are described and claimed.

Many modern system designs attempt to avoid vents, grills, and other openings that break or interrupt the visual look of a system. However, modern computing systems generate a large amount of heat so adequate cooling is still required. Many modern system attempt to hide or minimize the impact of vents and grills by placing them in inconspicuous location such as between a body of the system and display or on the bottom of the enclosure. These current solutions, however, may compromise the thermal performance of the system as the inlet efficacy may not be sufficient to cool the system and these inlets may have a tendency to become blocked or obstructed during normal usage of the system. Additionally, these conventional solutions may still require vents, grills and other openings that are not visually appealing. Consequently, various embodiments described herein provide for concealing venting solutions for computing systems without compromising efficacy.

Embodiments may include one or more elements. An element may comprise any structure arranged to perform certain operations. Each element may be implemented as hardware, software, or any combination thereof, as desired for a given set of design parameters or performance constraints. Although embodiments may be described with particular elements in certain arrangements by way of example, embodiments may include other combinations of elements in alternate arrangements.

It is worthy to note that any reference to "one embodiment" or "an embodiment" means that a particular feature, structure, or characteristic described in connection with the embodiment is included in at least one embodiment. The appearances of the phrases "in one embodiment" and "in an embodiment" in various places in the specification are not necessarily all referring to the same embodiment.

Figure 1:
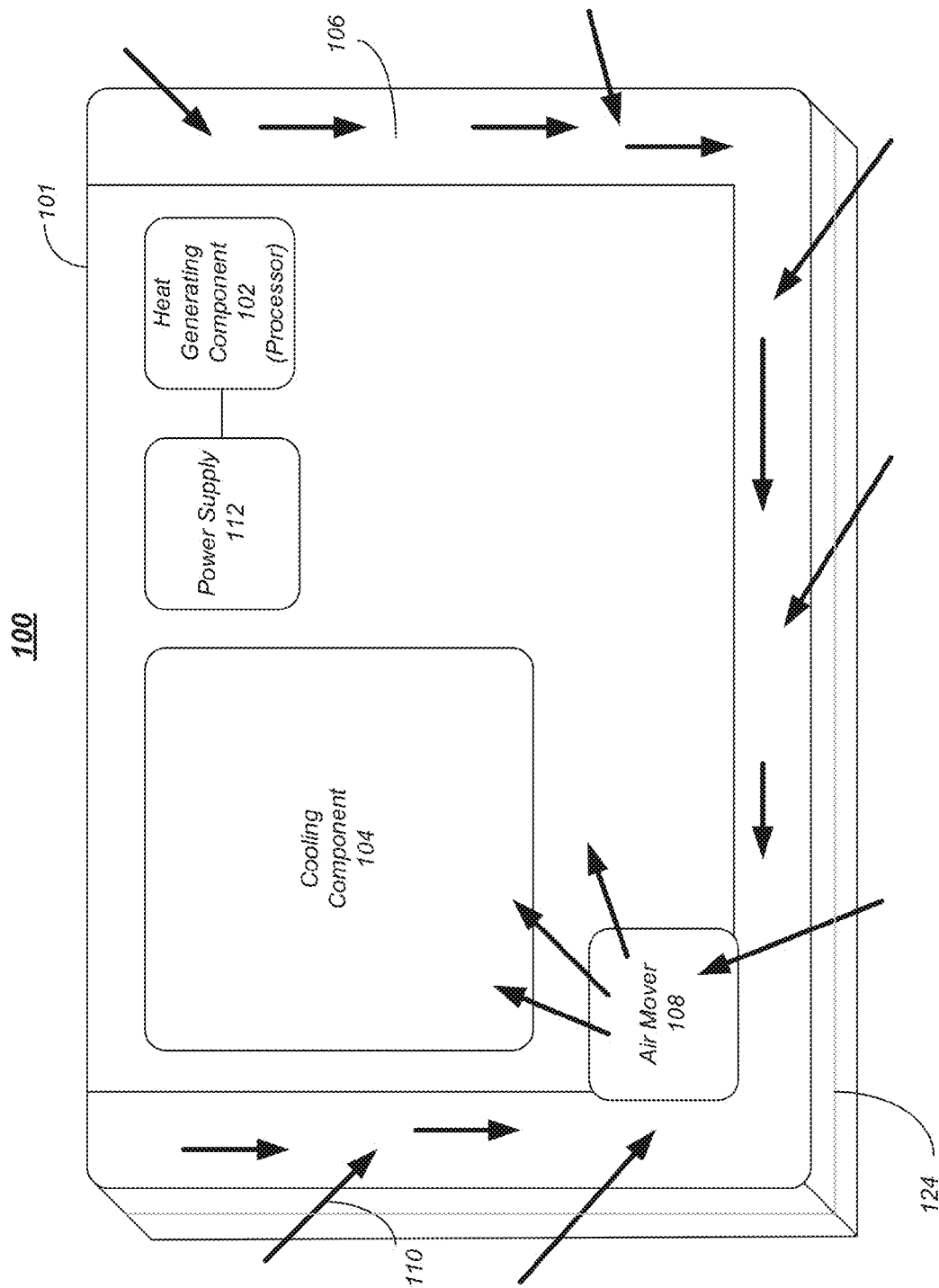
FIG. 1 illustrates one embodiment of a first apparatus.

FIG. 1 illustrates one embodiment of an apparatus. FIG. 1 illustrates a block diagram of an apparatus 100. Apparatus 100 may comprise a computing system or computing device in some embodiments. As shown in FIG. 1, apparatus 100 comprises multiple elements, such as enclosure 101, heat generating component 102, cooling component 104, duct 106, air mover 108, power supply 112 and seam inlet 124. Additionally, in various embodiments, the arrows of FIG. 1, indicated at 110 for example, may comprise an airflow or a direction of airflow.

While a limited number and arrangement of components are shown in FIG. 1 for purposes of illustration, it should be understood that computing device 100 may include any number or arrangement of components and still fall within the described embodiments. For example, computing device 100 may additionally include, in some embodiments, memory containing instructions to be executed by one or more multi-core processors for example. The embodiments, however, are not limited to the elements or the configuration shown in this figure. Additional components for mobile computing device 100 are discussed in further detail below with reference to FIG. 4.

In various embodiments, the mobile computing device 100 may comprise a tablet computer, handheld computer, personal digital assistant (PDA), cellular telephone, combination cellular telephone/PDA, smartphone, laptop computer, ultra-laptop computer, portable computer, personal computer (PC), notebook PC, netbook computer, tablet computer, pager, messaging device, media player, digital music player, or other suitable mobile computing device. The embodiments are not limited in this context.

In various embodiments, enclosure 101 may include a plurality of sides or surfaces. For example, enclosure 101 may include a first or top side and a second or bottom side. In some embodiments, the bottom side (not visible in FIG. 1) may be opposite the top side and together the two sides may form enclosure 101. In various embodiments, top side and bottom side may be joined or coupled together by any number of sides that are not part of the top and/or bottom side. In some embodiments, the enclosure 101 may be arranged around and configured to secure and protect one or more heat generating components 102. Other embodiments are described and claimed.

The one or more heat generating components 102 may comprise any suitable electric device, semiconductor device, system-on-chip or other component capable of generating heat in some embodiments. For example, the one or more heat generating components 102 may comprise a multi-core processor in various embodiments. In some embodiments, the one or more heat generating components 102 may include or comprise one or more radio modules or combination transmitter/receiver (e.g. transceiver) devices. In various embodiments, the transceiver device may comprise a device that has both a transmitter and a receiver that are combined and share common circuitry or a single housing. For example, in some embodiments, the transceiver may be operative to enable wireless communication capabilities for computing device 100. Other embodiments are described and claimed.

Air mover 108 may comprise any suitable device capable of creating a flow of air in some embodiments. For example, air mover 108 may comprise a fan or a blower arranged to generate a flow of air in computing device 100. In various embodiments, air mover 108 may include a rotating arrangement of vanes or blades that act on the air to generate an airflow or may include a fan wheel composed of a number of fan blades or ribs mounted around a hub to generate a flow of air. In some embodiments, air mover 108 may be arranged to generate pressure inside enclosure 101 to enable pressurized cooling of computing device 100. While a limited number and type of air movers are described and shown for purposes of illustration, any number, type or arrangement of air movers could be used and still fall within the described embodiments.

Power supply 112 may comprise any device suitable for providing electrical power to computing device 100 in various embodiments. For example, power supply 112 may comprise an AC power supply or a DC power supply. In some embodiments, power supply 112 may comprise a battery or other energy storage device capable of storing and providing power to computing device 100. Other embodiments are described and claimed.

In various embodiments, cooling component 104 may comprise or include one or more components arranged or configured to assist with or control cooling of the components 102, 108, 112 of computing device 100. For example, cooling component 104 may include, but is not limited to, one or more heat pipes, heat spreaders, heat sinks, phase change materials, liquid-based coolants or other cooling mechanisms to help mitigate the heat generated by the components of computing device 100.

Duct 106 may comprise a structure arranged inside of enclosure 101 to deliver and remove air 110 to assist in cooling one or more components of system 100 in some embodiments. For example, duct 106 may be arranged around a portion of an internal perimeter of the enclosure 101 in various embodiments and may be arranged to deliver air from outside of enclosure 101 to the inside of enclosure 101 via air mover 108. While some embodiments include active air mover 108, it should be understood that the embodiments described herein could employ passive cooling techniques (e.g. no air mover 108) and still fall within the described embodiments.

In various embodiments, duct 106 may be arranged to circumnavigate the internal perimeter of the enclosure 101. While shown as arranged only three sides of enclosure 101, it should be understood that duct 106 could be arranged around any number of sides around the internal perimeter of enclosure 101 and still fall within the described embodiments. For example, in some embodiments duct 106 may be arranged around the entire internal perimeter of enclosure 101. In other embodiments, the duct 106 may be arranged around more than one side of the enclosure 101 or around one or more corners of the enclosure 101. Other embodiments are described and claimed.

Duct 106 may comprise or be formed from any suitable material, such as plastic, steel, aluminum, carbon fiber, sheet metal, fiberglass, flexible ducting or, in some embodiments, may be formed as part of or integral with enclosure 101. For example, in various embodiments, duct 106 may be stamped or formed as part of the enclosure 101.

In some embodiments, duct 106 may be arranged to direct the airflow 110 into the enclosure 101 to cool the one or more heat generating components 102. In various embodiments, duct 106 may additionally be arranged to substantially isolate the one or more heat generating components 102 inside the enclosure 101. For example, duct 106 may be arranged to prevent foreign objects such as paper clips, water or other harmful materials from entering the area defined inside enclosure 101 defined by an internal perimeter of the duct 106.

In various embodiments, enclosure 101 may taper to a smaller thickness near its perimeter. In these embodiments, duct 106 may be configured to fill the tapered space that may otherwise comprise unusable space because this space may not be suitable for electronics components. The size, shape, configuration, dimensions and other parameters of duct 106 may be determined based on any number of factors, including but not limited to volume of air required, available space inside enclosure 101 or location of other components. One skilled in the art will appreciate that the duct 106 could take on any number of forms and the embodiments are not limited in this context.

Seam inlet 124 may comprise an opening arranged around a portion of an external perimeter of the enclosure 101 to allow an airflow 110 to enter the duct 106 in various embodiments. In some embodiments, air mover 108 may be arranged to draw the airflow 110 into the duct 106 through the seam inlet 124. In some embodiments, seam inlet 124 may comprise a long narrow slit that circumnavigates the external perimeter of the enclosure 101. For example, seam inlet 124 may comprise a contiguous ½ mm to 2 mm opening around the external perimeter of the enclosure 101.

In various embodiments, seam inlet 124 may be arranged as an opening around the entire perimeter of enclosure 101. In other embodiments, seam inlet 124 may be arranged as an opening only in areas where duct 106 is present. In other embodiments, the seam inlet 124 may be arranged around more than one side of the enclosure 101 or around one or more corners of the enclosure 101. In some embodiments, the seam inlet 124 may be hidden or substantially hidden in a natural bend or break in the industrial design of the enclosure 101. In various embodiments, the enclosure 101 may comprise or include a top portion and a bottom portion and the seam inlet 124 may be arranged as an opening between the top portion and the bottom portion. By placing the seam inlet 124 where the top portion and bottom portion of enclosure 101 meet, it may be possible to minimize the visual impact of the seam inlet 124. In this way, seam inlet 124 may replace other vents or openings that are not as visually appealing.

Figure 2A:
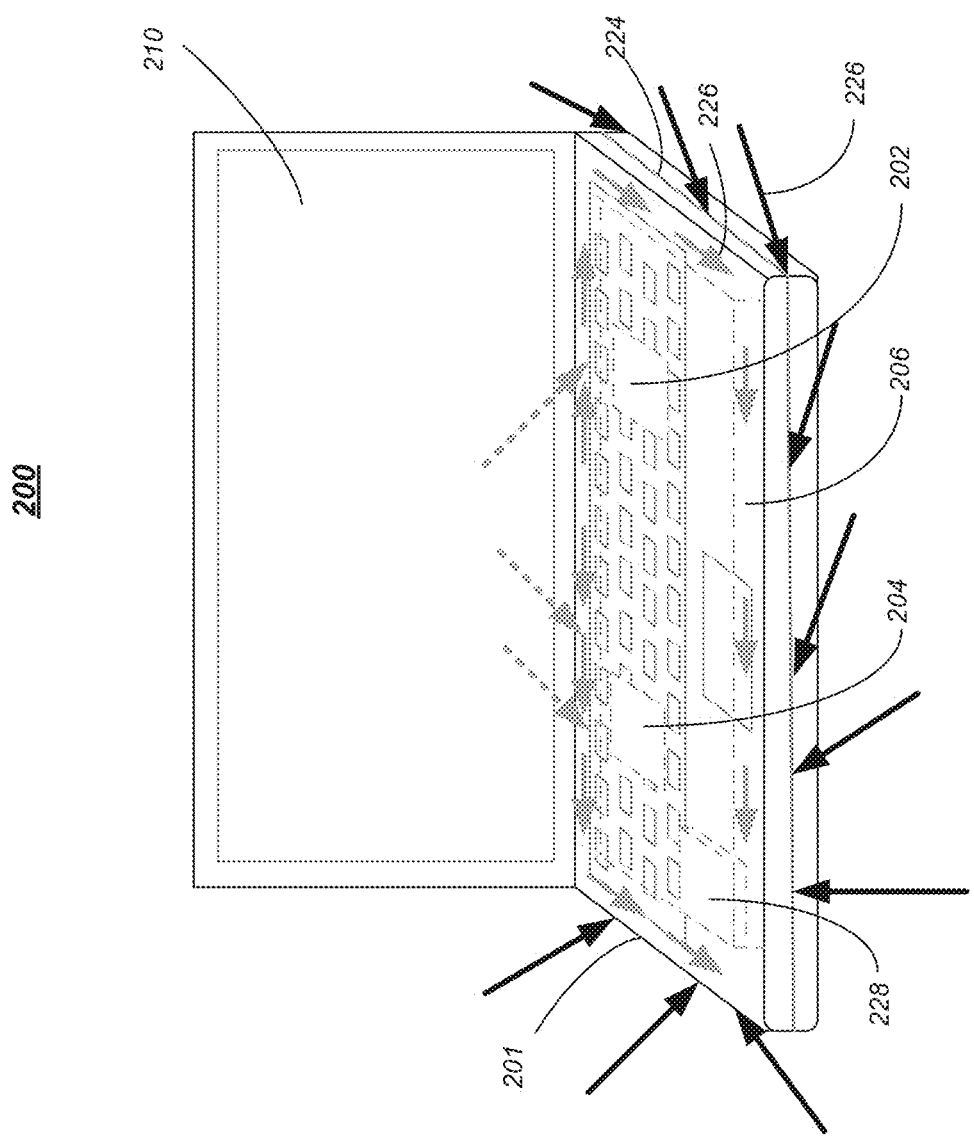
FIG. 2A illustrations one embodiment of a second apparatus.

FIG. 2A illustrates an apparatus 200. Apparatus 200 may comprise a mobile computing device, laptop or notebook computer in some embodiments. Computing device 200 may comprise, be the same or be similar to computing device 100 of FIG. 1 in some embodiments. As shown in FIG. 2A, computing device 200 may comprises or include multiple elements, such as enclosure 201, heat generating component 202, cooling component 204, duct 206, air mover 208, and seam inlet 224 and display 210. Additionally, in various embodiments, the arrows of FIG. 2A, indicated at 226 for example, may comprise an airflow or a direction of airflow. The components and elements described in FIG. 2A may be the same or similar to like components described in FIG. 1. The embodiments are not limited in this context.

In various embodiments, display 210 may be coupled to enclosure 201 such that the display 210 may be rotated with respect to the enclosure 201. In other embodiments, display 210 may be integrated within enclosure 201. The display 210 may comprise a cathode ray tube (CRTs), liquid crystal displays (LCDs), touch screen display or any other type of display. Other embodiments are described and claimed.

As shown in FIG. 2A, in various embodiments duct 206 and seam inlet 224 may be arranged to circumnavigate the entire perimeter of enclosure 201. In this arrangement, airflow 226 may be drawn into duct 206 and subsequently into the inside of enclosure 201 over a large area with minimal visual impact on the system. Drawing air into the system over a large area may have several advantages over vents, grills or other openings that are isolated to a small area of the system. For example, the change of substantial blockage of the seam inlet 224 is minimal. In other systems that include localized vents and grills, blockages are common and may result in system overheating and decreased system performance.

FIG. 2B illustrates an apparatus 250. Apparatus 250 may comprise a mobile computing device, laptop or notebook computer in some embodiments that is the same or be similar to computing device 100 of FIG. 1 and computing device 200 of FIG. 2A. As shown in FIG. 2B, computing device 250 may comprises or include multiple elements, such as enclosure 201, heat generating component 202, cooling component 204, duct 206, seam inlet 224 and speaker 260. Additionally, in various embodiments, the arrows of FIG. 2B, indicated at 226 for example, may comprise an airflow or a direction of airflow. Similarly, the arrows indicated at 262 may comprise sound, music or other acoustic output from speaker 260. The embodiments are not limited to the number, type or arrangement of components and elements shown in FIG. 2B.

As shown in FIG. 2B, the enclosure 201 may include a top portion 270, a bottom portion 272 and one or more side portions 274. In some embodiments, the top portion 270 may have a larger outside diameter or dimension than the bottom portion 272. In this arrangement, tapering may occur for the enclosure 101 as the side portion 274 angles downward from the top portion 270 toward the bottom portion 272 from a top perspective view. This tapering may allow for the seam inlet 224 to be arranged on the tapered connection of side portion 274 between the top portion 270 and the bottom portion 272 in some embodiments. In various embodiments, this placement of seam inlet 224 may further reduce the visual impact of the described concealed venting embodiments.

In various embodiments, duct 206 may be arranged to fill the space created or defined by the tapered connection 274 between the top portion 270 and the bottom portion 272. The embodiments are not limited in this context.

The seam inlet 224 may comprise an acoustic outlet for the apparatus 250 in some embodiments. For example, in various embodiments, apparatus 250 may include speaker 260. Speaker 260 may comprise any suitable acoustic output component, such as an electroacoustic transducer that produces sound in response to an electrical audio signal input. In various embodiments, speaker 260 may be arranged inside enclosure 201 or inside duct 206 and the acoustic output of speaker 260 may be allowed to escape from enclosure 201 through duct 206 and seam inlet 224 as illustrated at 262. Other embodiments are described and claimed.

The above-described embodiments may be used to improve airflow in computing devices while minimizing the visual impact of vents and openings. In various embodiments, the above-described techniques and embodiments may be applicable to tablets and other computing devices that are expected or arranged to be operated by a user using one or two hands to hold the device and in a variety of orientations. In these and other embodiments, including the above-described perimeter-seam inlet may make it much less likely that the users hands will block the inlet whereas a localized inlet could be easily blocked by certain hand placements. In various embodiments, use of any of the above described arrangements of ducts and seam inlets may result in enhanced cooling capability compared to traditional cooling methods that rely on strategically placed inlets and grills that may become blocked. As such, substantial improvements in both pressure and flow can be achieved through the above-described embodiments.

Figure 3:
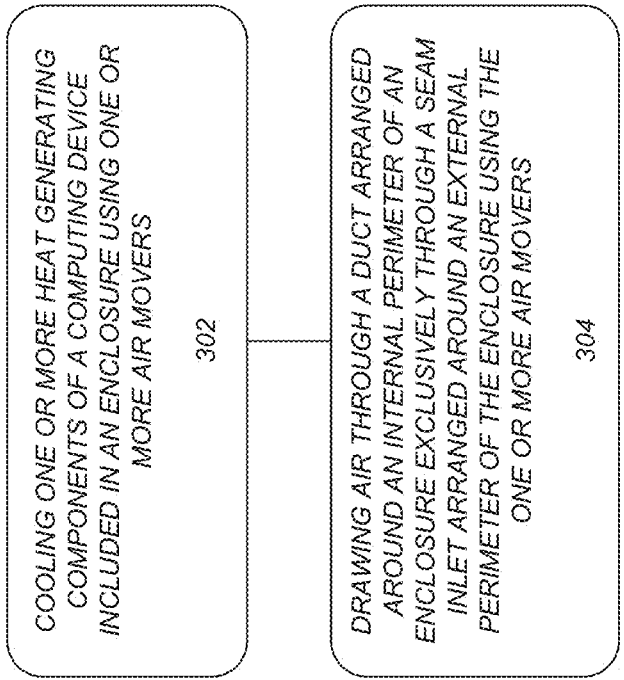
FIG. 3 illustrations one embodiment of a logic diagram.

FIG. 3 illustrates one embodiment of a logic flow 300. The logic flow 300 may be performed by various systems and/or devices and may be implemented as hardware, software, firmware, and/or any combination thereof, as desired for a given set of design parameters or performance constraints. For example, one or more operations of the logic flow 300 may be implemented by executable programming or non-transitory computer-readable instructions to be executed by a logic device (e.g., computer, processor). Logic flow 300 may describe the thermal management described above with reference to FIGS. 1, 2A and 2B. Other embodiments are described and claimed.

In various embodiments, one or more heat generating components of a computing device included in an enclosure may be cooled using one or more air movers. For example, air mover 108 may be configured to cool the heat generating component 102. In some embodiments, at 304, air may be drawn through a duct arranged around an internal perimeter of the enclosure exclusively through a seam inlet arranged around an external perimeter of the enclosure. For example, in lieu of other openings, vents, grills or inlets, air 110 may be drawn into duct 106 exclusively through seam inlet 124 by air mover 108 to cool components inside of enclosure 101.

Positive pressure may be generated inside of the enclosure in some embodiments. For example, in various embodiments, air mover 108 may be arranged to generate positive pressure inside of enclosure 101 to assist with the cooling of heat generating component 102. Other embodiments are described and claimed.

Figure 4:
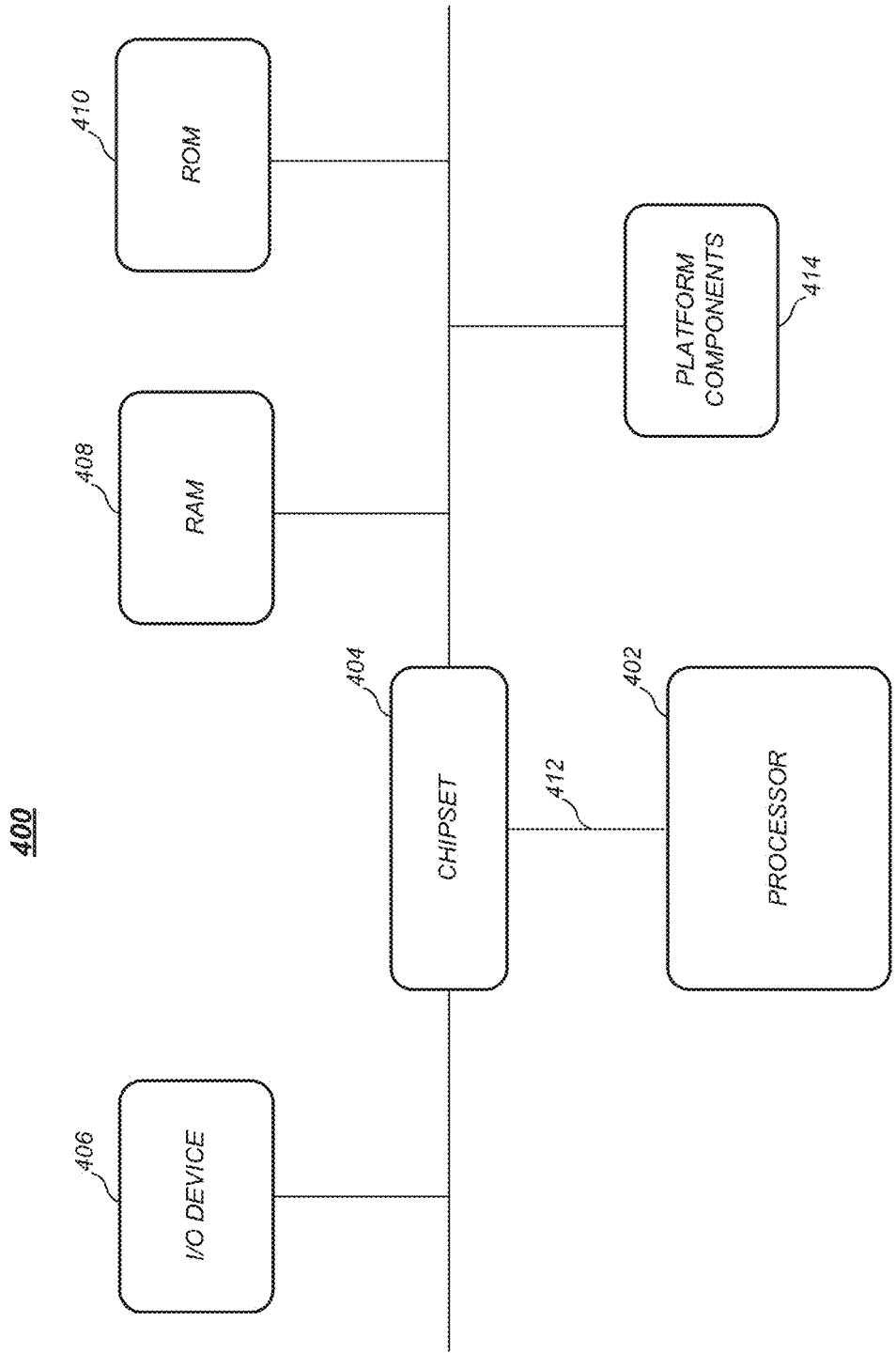
FIG. 4 illustrates one embodiment of a system.

FIG. 4 is a diagram of an exemplary system embodiment. In particular, FIG. 4 is a diagram showing a system 400, which may include various elements. For instance, FIG. 4 shows that system 400 may include a processor 402, a chipset 404, an input/output (I/O) device 406, a random access memory (RAM) (such as dynamic RAM (DRAM)) 408, and a read only memory (ROM) 410, and various platform components 414 (e.g., a fan, a crossflow blower, a heat sink, DTM system, cooling system, housing, vents, and so forth). These elements may be implemented in hardware, software, firmware, or any combination thereof. The embodiments, however, are not limited to these elements.

In particular, the platform components 414 may include a cooling system implementing various thermal management techniques. The cooling system may be sized for the system 400, and may include any cooling elements designed to perform heat dissipation, such as heat pipes, heat links, heat transfers, heat spreaders, vents, fans, blowers, crossflow blowers and liquid-based coolants.

As shown in FIG. 4, I/O device 406, RAM 408, and ROM 410 are coupled to processor 402 by way of chipset 404. Chipset 404 may be coupled to processor 402 by a bus 412. Accordingly, bus 412 may include multiple lines.

Processor 402 may be a central processing unit comprising one or more processor cores and may include any number of processors having any number of processor cores. The processor 402 may include any type of processing unit, such as, for example, CPU, multi-processing unit, a reduced instruction set computer (RISC), a processor that have a pipeline, a complex instruction set computer (CISC), digital signal processor (DSP), and so forth.

Although not shown, the system 400 may include various interface circuits, such as an Ethernet interface and/or a Universal Serial Bus (USB) interface, and/or the like. In some exemplary embodiments, the I/O device 406 may comprise one or more input devices connected to interface circuits for entering data and commands into the system 400. For example, the input devices may include a keyboard, mouse, touch screen, track pad, track ball, isopoint, a voice recognition system, and/or the like. Similarly, the I/O device 406 may comprise one or more output devices connected to the interface circuits for outputting information to an operator. For example, the output devices may include one or more displays, printers, speakers, and/or other output devices, if desired. For example, one of the output devices may be a display. The display may be a cathode ray tube (CRTs), liquid crystal displays (LCDs), or any other type of display.

The system 400 may also have a wired or wireless network interface to exchange data with other devices via a connection to a network. The network connection may be any type of network connection, such as an Ethernet connection, digital subscriber line (DSL), telephone line, coaxial cable, etc. The network may be any type of network, such as the Internet, a telephone network, a cable network, a wireless network, a packet-switched network, a circuit-switched network, and/or the like.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a machine-readable or computer-readable medium or article which may store an instruction, a set of instructions or computer executable code that, if executed by a machine or processor, may cause the machine or processor to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter that lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising:
   an enclosure arranged around one or more heat generating components;
   a duct arranged around a portion of an internal perimeter of the enclosure; and
   a seam inlet arranged around a portion of an external perimeter of the enclosure to allow an airflow to enter the duct;
   wherein the seam inlet circumnavigates the external perimeter of the enclosure and the duct circumnavigates the internal perimeter of the enclosure.

2. The apparatus of claim 1, comprising:
   one or more air movers to draw the airflow into the duct through the seam inlet.

3. The apparatus of claim 1, wherein the duct is arranged to direct the airflow into the enclosure to cool the one or more heat generating components.

4. The apparatus of claim 1, wherein the seam inlet is substantially hidden in a natural bend or break in the industrial design of the enclosure.

5. The apparatus of claim 1, wherein the enclosure comprises a top portion and a bottom portion and the seam inlet is arranged as an opening between the top portion and the bottom portion.

6. The apparatus of claim 5, wherein the top portion has a larger outside diameter than the bottom portion and the seam inlet is arranged on a tapered connection between the top portion and the bottom portion.

7. The apparatus of claim 1, wherein the seam inlet comprises a contiguous ½ mm to 2 mm opening around at least a portion of the external perimeter of the enclosure.

8. The apparatus of claim 1, wherein the duct is arranged to substantially isolate the one or more heat generating components inside the enclosure.

9. The apparatus of claim 1, comprising:
   a digital display coupled to the enclosure.

10. The apparatus of claim 1, wherein the seam inlet comprises an acoustic outlet for the apparatus.

11. A system, comprising:
    a computing device including an enclosure, the enclosure defining an interior containing at least one heat generating component;
    a duct arranged around a portion of a perimeter of the interior of the enclosure;
    a seam inlet arranged around a portion of an external perimeter of the enclosure; and
    one or more air movers arranged to draw an airflow into the duct through the seam inlet to cool the one or more heat generating components.

12. The system of claim 11, wherein the seam inlet circumnavigates the external perimeter of the enclosure and the duct circumnavigates the perimeter of the interior of the enclosure.

13. The system of claim 11, wherein the enclosure comprises a top portion and a bottom portion, wherein the seam inlet is arranged as an opening between the top portion and the bottom portion.

14. The system of claim 13, wherein the top portion has a larger outside diameter than the bottom portion and the seam inlet is arranged on a tapered connection between the top portion and the bottom portion.

15. The system of claim 11, wherein the seam inlet comprises a contiguous ½ mm to 2 mm opening around at least a portion of the external perimeter of the enclosure.

16. A method, comprising:
    drawing an airflow exclusively through a seam inlet arranged around a portion of an external perimeter of an enclosure into a duct arranged around a portion of an internal perimeter of the enclosure using one or more air movers arranged to generate positive pressure inside the enclosure; and
    cooling one or more heat generating components included inside the enclosure using the airflow.

17. The method of claim 16, wherein the seam inlet circumnavigates the external perimeter of the enclosure and the duct circumnavigates the perimeter of the interior of the enclosure.

18. The method of claim 16, the enclosure having a top portion and a bottom portion, wherein the seam inlet is arranged as an opening or gap between the top portion and the bottom portion.

19. The method of claim 18, wherein the top portion has a larger outside perimeter than the bottom portion and the seam inlet is arranged on a tapered connection between the top portion and the bottom portion.

20. The method of claim 16, wherein the seam inlet comprises a contiguous ½ mm to 2 mm opening around at least a portion of the external perimeter of the enclosure.

* * * * *